(12) United States Patent
Van Driest

(10) Patent No.: US 10,581,421 B2
(45) Date of Patent: Mar. 3, 2020

(54) PHASE DETECTOR

(71) Applicant: Qorvo US, Inc., Greensboro, NC (US)

(72) Inventor: Hans Van Driest, The Hague (NL)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/175,184

(22) Filed: Oct. 30, 2018

(65) Prior Publication Data

US 2019/0140629 A1     May 9, 2019

Related U.S. Application Data

(60) Provisional application No. 62/581,890, filed on Nov. 6, 2017.

(51) Int. Cl.
| | |
|---|---|
| *G01R 25/00* | (2006.01) |
| *H03K 5/26* | (2006.01) |
| *H04B 1/16* | (2006.01) |
| *H03K 4/08* | (2006.01) |

(52) U.S. Cl.
CPC .......... *H03K 5/26* (2013.01); *G01R 25/005* (2013.01); *H03K 4/08* (2013.01); *H04B 1/16* (2013.01)

(58) Field of Classification Search
CPC ...... H03D 13/003; H03D 13/004; H03K 5/26; H03K 4/08; G01R 25/00; G01R 25/005; H04B 1/16; H03L 7/085; H03L 7/0891
See application file for complete search history.

(56) References Cited

U.S. PATENT DOCUMENTS

| | | | |
|---|---|---|---|
| 8,611,479 B2 | 12/2013 | Rao et al. | |
| 9,160,351 B2 * | 10/2015 | Chen | ...................... H03L 7/091 |
| 2013/0216014 A1 | 8/2013 | Kong et al. | |
| 2017/0170838 A1 | 6/2017 | Pagnanelli | |
| 2017/0244417 A1 * | 8/2017 | Staszewski | .......... H03C 3/0966 |

OTHER PUBLICATIONS

Extended European Search Report for European Patent Application No. 18203875.2, dated Mar. 11, 2019, 8 pages.

* cited by examiner

*Primary Examiner* — Long Nguyen
(74) *Attorney, Agent, or Firm* — Withrow & Terranova, P.L.L.C.

(57) ABSTRACT

Phase detector circuitry includes oscillator circuitry, edge detection and correction circuitry, sampler circuitry, and adder circuitry. The oscillator circuitry is configured to provide a sawtooth oscillator signal. The edge detection and correction circuitry is configured to receive an in-phase signal and a quadrature signal, provide an edge detection signal during each edge of the in-phase signal and the quadrature signal, and provide an edge correction signal based on whether the edge is in the in-phase signal or the quadrature signal and whether the edge is a rising edge or a falling edge. The sampler circuitry is configured to sample the sawtooth oscillator signal in response to the edge detection signal. The adder circuitry is configured to subtract the edge correction signal from the sampled sawtooth oscillator signal to provide a phase estimate signal.

12 Claims, 3 Drawing Sheets

PHASE DETECTOR

RELATED APPLICATIONS

This application claims the benefit of U.S. provisional patent application Ser. No. 62/581,890, filed Nov. 6, 2017, the disclosure of which is hereby incorporated herein by reference in its entirety.

FIELD OF THE DISCLOSURE

The present disclosure relates to systems and methods for measuring the phase of a signal.

BACKGROUND

The phase of a signal provides valuable information that may be useful in several applications. For example, the phase of a wireless communication signal as it is received at multiple antennas may be used to determine an angle of arrival of the wireless communication signal, which indicates a direction from which the wireless communication signal was transmitted relative to a receiver. Conventional systems and methods for measuring the phase of a wireless communication signal rely on a highly linear receiver. However, highly linear receivers are costly both monetarily and in terms of power consumption. Accordingly, phase measurement and thus angle of arrival estimation has been unavailable for low-cost and low-power applications such as Internet of Things (IoT) devices. In light of the above, there is a need for systems and methods for measuring the phase of a wireless receive signal that are suited to non-linear (e.g., hard limiting) receiver architectures.

SUMMARY

In one embodiment, phase detector circuitry includes oscillator circuitry, edge detection and correction circuitry, sampler circuitry, and adder circuitry. The oscillator circuitry is configured to provide a sawtooth oscillator signal. The edge detection and correction circuitry is configured to receive an in-phase signal and a quadrature signal, provide an edge detection signal during each edge of the in-phase signal and the quadrature signal, and provide an edge correction signal based on whether the edge is in the in-phase signal or the quadrature signal and whether the edge is a rising edge or a falling edge. The sampler circuitry is coupled to the oscillator circuitry and the edge detection and correction circuitry. The sampler circuitry is configured to sample the sawtooth oscillator signal in response to the edge detection signal. The adder circuitry is coupled to the sampler circuitry and the edge detection and correction circuitry. The adder circuitry is configured to subtract the edge correction signal from the sampled sawtooth oscillator signal to provide a phase estimate signal. By providing the phase estimate signal based on the edges of the in-phase signal and the quadrature signal, the phase estimate signal may provide a repeatably accurate phase measurement even when the in-phase signal and the quadrature signal are components of a hard-limited wireless communication signal.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
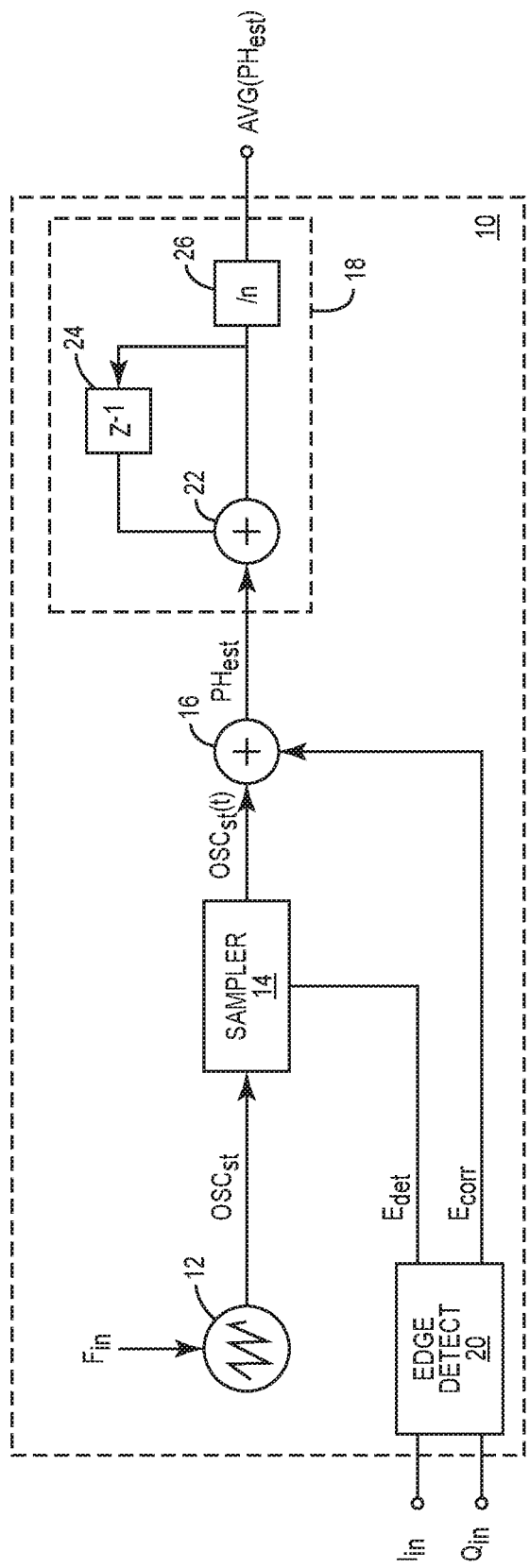
FIG. 1 illustrates phase detector circuitry according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 shows phase detector circuitry 10 according to one embodiment of the present disclosure. The phase detector circuitry 10 includes oscillator circuitry 12, sampler circuitry 14 coupled to the oscillator circuitry 12, adder circuitry 16 coupled to the sampler circuitry 14, averaging circuitry 18 coupled to the adder circuitry 16, and edge detection and correction circuitry 20 coupled to the sampler circuitry 14 and the adder circuitry 16.

In operation, the oscillator circuitry 12 provides a sawtooth oscillator signal $OSC_{st}$ with a value that varies between 0 and 360 at a frequency determined by an input frequency signal $F_{in}$. The edge detection and correction circuitry 20 receives an in-phase signal $I_{in}$ and a quadrature input signal $Q_{in}$ and provides an edge detection signal $E_{det}$ and an edge correction signal $E_{corr}$. The edge detection signal $E_{det}$ is provided only during an edge of either of the in-phase signal $I_{in}$ and the quadrature signal $Q_{in}$. In response to the edge detection signal $E_{det}$, the sampler circuitry 14 samples the sawtooth oscillator signal $OSC_{st}$ to provide a sampled sawtooth oscillator signal $OSC_{st}(t)$ to the adder circuitry 16. The adder circuitry 16 subtracts the edge correction signal $E_{corr}$ from the sampled sawtooth oscillator signal $OSC_{st}(t)$ to provide a phase estimate signal $PH_{est}$.

When the edge detection and correction circuitry 20 detects a rising edge of the in-phase signal $I_{in}$, the edge correction signal $E_{corr}$ is provided with a value of 180. When the edge detection and correction circuitry 20 detects a falling edge of the in-phase signal $I_{in}$, the edge correction signal $E_{corr}$ is provided with a value of 0. When the edge detection and correction circuitry 20 detects a rising edge of the quadrature signal $Q_{in}$, the edge correction signal $E_{corr}$ is provided with a value of 270. When the edge detection and correction circuitry 20 detects a falling edge of the quadrature signal $Q_{in}$, the edge correction signal $E_{corr}$ is provided with a value of 90.

The effect of the edge correction signal $E_{corr}$ is to normalize the sampled sawtooth oscillator signal $OSC_{st}(t)$ for each edge of the in-phase signal $I_{in}$ and the quadrature signal $Q_{in}$. Taking the falling edge of the in-phase signal $I_{in}$ as a reference, those skilled in the art will readily appreciate that the rising edge of the in-phase signal $I_{in}$ will be 180 degrees out of phase, the falling edge of the quadrature signal $Q_{in}$ will be 270 degrees out of phase, and the rising edge of the quadrature signal $Q_{in}$ will be 90 degrees out of phase with this edge. Accordingly, the phase estimate signal $PH_{est}$ reflects a normalized estimate of the phase at each edge of the in-phase signal $I_{in}$ and the quadrature signal $Q_{in}$.

The averaging circuitry 18 includes an averaging adder 22, a delay 24, and a divider 26. The phase estimate signal $PH_{est}$ is provided to the averaging adder 22, where it is added to one or more previous phase estimates held in the delay 24. The combined phase estimates at the output of the averaging adder 22 are divided by the number of phase estimates to provide an averaged phase estimate $AVG(PH_{est})$.

While the oscillator circuitry 12, the sampler circuitry 14, the adder circuitry 16, the averaging circuitry 18, and the edge detection and correction circuitry 20 are shown in FIG. 1 as separate functional components, those skilled in the art will readily appreciate that the functionality provided thereby may be further separated or combined into any number of different functional components, all of which are contemplated herein.

Figure 2:
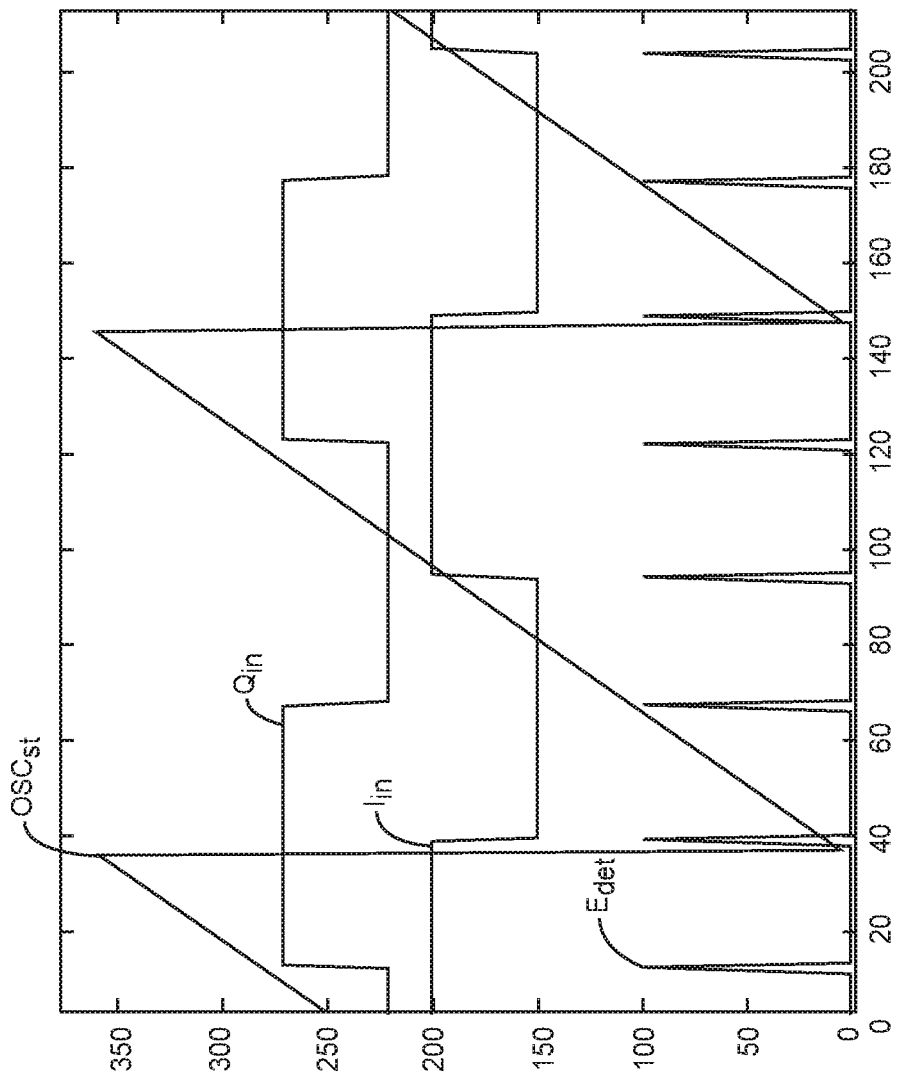
FIG. 2 is a graph illustrating the operation of phase detector circuitry according to one embodiment of the present disclosure.

FIG. 2 is a graph illustrating the sawtooth oscillator signal $OSC_{st}$, the in-phase signal $I_{in}$, the quadrature signal $Q_{in}$, and the edge detection signal $E_{det}$. In FIG. 2, the Y-axis is representative of signal amplitude while the X-axis is representative of time. Notably, the in-phase signal $I_{in}$, the quadrature signal $Q_{in}$, and the edge detection signal $E_{det}$ are arbitrarily placed with respect to the Y-axis. As shown, the sawtooth oscillator signal $OSC_{st}$ has a value that varies between 0 and 360. The in-phase signal $I_{in}$ and the quadrature signal $Q_{in}$ are shown as 1-bit quantized signals, as would occur if the in-phase signal $I_{in}$ and the quadrature signal $Q_{in}$ were components of a wireless communications signal received by a hard-limiting receiver architecture. In such a case, the in-phase signal $I_{in}$ and the quadrature signal $Q_{in}$ are represented as binary signals, in which all information about the phase thereof is contained at the edges thereof. Notably, the edges of the in-phase signal $I_{in}$ and the quadrature signal $Q_{in}$ represent zero crossings of the non-quantized and non-limited versions thereof, which would normally be sinusoidal signals. The edge detection signal $E_{det}$ is shown provided at each edge of the in-phase signal $I_{in}$ and the quadrature signal $Q_{in}$.

As shown in FIG. 2, at a falling edge of the in-phase signal $I_{in}$, the value of the sawtooth oscillator signal $OSC_{st}$ is around 10. At a rising edge of the in-phase signal $I_{in}$, the value of the sawtooth oscillator signal $OSC_{st}$ is around 190. Subtracting 180 from the value of the sawtooth oscillator signal $OSC_{st}$, which is the value of the edge correction signal $E_{corr}$ as provided by the edge detection and correction circuitry 20 during a rising edge of the in-phase signal $I_{in}$, provides the same value of 10 obtained during the falling edge of the in-phase signal $I_{in}$. At a rising edge of the quadrature signal $Q_{in}$, the value of the sawtooth oscillator signal $OSC_{st}$ is around 280. Subtracting 270 from the value of the sawtooth oscillator signal $OSC_{st}$, which is the value of the edge correction signal $E_{corr}$ as provided by the edge detection and correction circuitry 20 during a rising edge of the quadrature signal $Q_{in}$, provides the same value of 10 obtained during the falling edge of the in-phase signal $I_{in}$. Finally, at a falling edge of the quadrature signal $Q_{in}$, the value of the sawtooth oscillator is around 100. Subtracting 90 from the value of the sawtooth oscillator signal $OSC_{st}$, which is the value of the edge correction signal $E_{corr}$ as provided by the edge detection and correction circuitry 20 during a falling edge of the quadrature signal $Q_{in}$, provides the same value of 10 obtained during the falling edge of the in-phase signal $I_{in}$. In this way, a phase estimate may be obtained at each edge of the in-phase signal $I_{in}$ and the quadrature signal $Q_{in}$. While the examples above are given such that the phase estimate at each edge of the in-phase signal $I_{in}$ and quadrature signal $Q_{in}$ result in the same value, the values will often be different. The averaging circuitry 18 is thus important to average the difference between the phase estimates at each edge of the in-phase signal $I_{in}$ and the quadrature signal $Q_{in}$ such that the averaged phase estimate signal AVG($PH_{est}$) more accurately reflects an actual phase of a wireless communication signal composed of the in-phase signal $I_{in}$ and the quadrature signal $Q_{in}$.

While the phase detector circuitry 10 may be operated to sample the in-phase signal $I_{in}$ and the quadrature signal $Q_{in}$ for any period of time to provide the averaged phase estimate signal AVG($PH_{est}$) for any number of edges thereof, in one embodiment at least four phase estimate signals $PH_{est}$ from at least four edges of the in-phase signal $I_{in}$ and the quadrature signal $Q_{in}$ are averaged to provide the averaged phase estimate signal AVG($PH_{est}$).

As discussed above, the oscillator circuitry 12 operates at a frequency determined by the input frequency $F_{in}$. While not shown receiving the input frequency $F_{in}$, the edge detection and correction circuitry 20 may also operate at such a frequency, which determines the sample rate thereof. Those skilled in the art will readily appreciate that the input frequency $F_{in}$ should be chosen to be significantly higher than a frequency of the in-phase signal $I_{in}$ and the quadrature signal $Q_{in}$. In one embodiment, the input frequency $F_{in}$ should be at least two orders of magnitude higher than a frequency of the in-phase signal $I_{in}$ and the quadrature signal $Q_{in}$. For example, if a frequency of the in-phase signal $I_{in}$ and the quadrature signal $Q_{in}$ is 1.75 MHz, the input frequency $F_{in}$ may be chosen to be 192 MHz. This means there are 192/1.75 samples in each period of the in-phase signal $I_{in}$ and the quadrature signal $Q_{in}$, providing a resolution of approximately 3.3 degrees per sample (360 degrees in each period).

The phase detector circuitry 10 may be especially useful in applications not requiring an absolute measurement of phase, such as for angle of arrival estimation in which only a relative phase between the same wireless communication signal received at different antennas is required. Notably, the phase detector circuitry 10 may be less susceptible to common sources of systematic errors than conventional phase measurement circuitry. Typical sources of systematic errors in conventional phase estimation circuitry include IQ phase offset, in which a deviation from the ideal 90 degrees of phase separation between an in-phase signal and a quadrature signal occur, IQ unbalance, in which there is a difference in gain between the in-phase signal and the quadrature signal, and DC offset in the in-phase signal and the quadrature signal.

With respect to IQ phase offset, this will result in different phase estimate values $PH_{est}$ at the edges of the in-phase signal $I_{in}$ and the quadrature signal $Q_{in}$, which will in turn shift the averaged phase estimate value AVG($PH_{est}$). However, this shift is independent of the absolute input phase, and will always give the same phase shift or offset in the measured phase. In applications in which only the relative or difference in phase between signals is required, this fixed phase offset results in no degradation.

With respect to IQ unbalance, this will be of no consequence in a hard-limited receiver in which the in-phase signal $I_{in}$ and the quadrature signal $Q_{in}$ are quantized to 1-bit as discussed above, because the hard-limiting results in only two signal levels and thus removes the difference in gain.

With respect to DC offset, while this will have an effect on the duty cycle of the in-phase signal $I_{in}$ and/or the quadrature signal $Q_{in}$, this change is symmetrical and thus will cancel out since both the rising and falling edges are included in the averaged phase estimate signal AVG($PH_{est}$).

Figure 3:
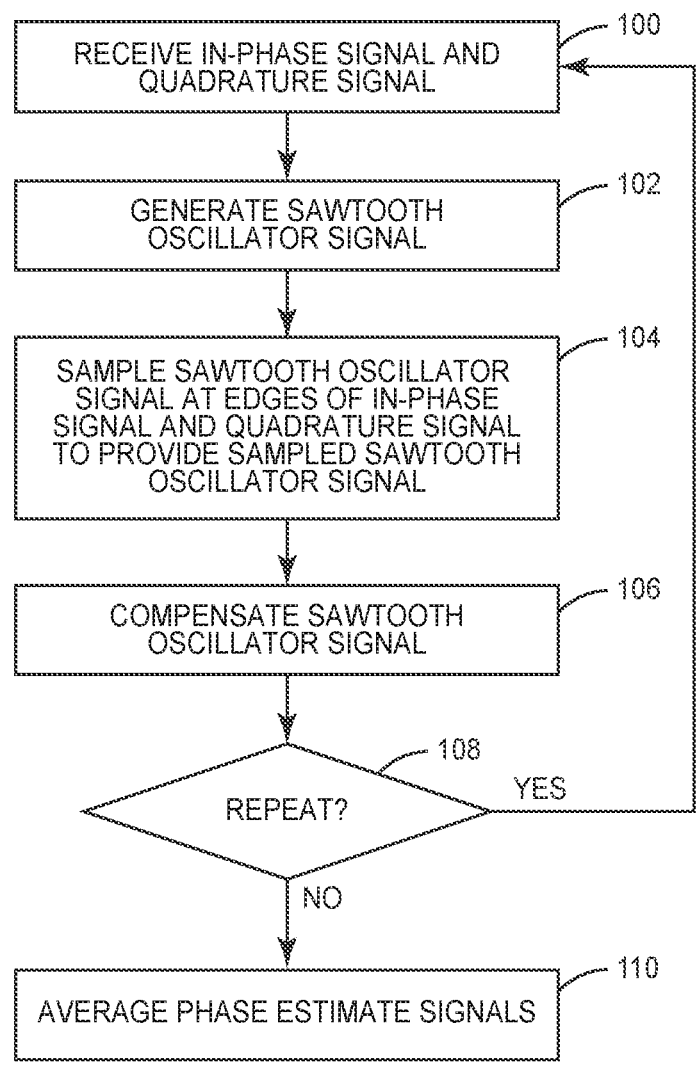
FIG. 3 is a flow diagram illustrating a method for estimating the phase of a signal according to one embodiment of the present disclosure.

FIG. 3 illustrates a method for estimating phase according to one embodiment of the present disclosure. First, an in-phase signal and a quadrature signal are received (step 100). A sawtooth oscillator signal is generated (step 102). The sawtooth oscillator signal is sampled at each edge of the in-phase signal and the quadrature signal (step 104) to provide a sampled sawtooth oscillator signal. The sampled sawtooth oscillator signal is compensated based on whether the edge is on the in-phase signal or the quadrature signal and whether the edge is a rising edge or a falling edge (step 106) to provide a phase estimate signal. Finally, the above process is repeated as many times as desired (step 108), and a number of phase estimate signals are averaged (step 110) to provide an averaged phase estimate signal.

As discussed above, a value of the sawtooth oscillator signal varies between 0 and 360. Further as discussed above, compensating the sampled sawtooth oscillator based on whether the edge is on the in-phase signal or the quadrature signal and whether the edge is a rising edge may be accomplished by not changing the value of the sampled sawtooth oscillator signal when the edge is a falling edge of the in-phase signal, subtracting 180 from the sampled sawtooth oscillator signal when the edge is a rising edge of the in-phase signal, subtracting 270 from the sampled sawtooth oscillator signal when the edge is a rising edge of the quadrature signal, and subtracting 90 from the sampled sawtooth oscillator signal when the edge is a falling edge of the quadrature signal. The in-phase signal and the quadrature signal may be components of a wireless communication signal. In one embodiment, the wireless communication signal is hard-limited, and the in-phase signal and the quadrature signal are quantized to 1-bit signals.

Those skilled in the art will recognize improvements and modifications to the preferred embodiments of the present disclosure. All such improvements and modifications are considered within the scope of the concepts disclosed herein and the claims that follow.

What is claimed is:
1. Phase detector circuitry comprising:
oscillator circuitry configured to provide a sawtooth oscillator signal;
edge detection and correction circuitry configured to:
    receive an in-phase signal and a quadrature signal;
    provide an edge detection signal during each edge of the in-phase signal and the quadrature signal; and
    provide an edge correction signal, wherein the edge correction signal is based on whether the edge is in the in-phase signal or the quadrature signal and whether the edge is a rising edge or a falling edge;
sampler circuitry coupled to the oscillator circuitry and the edge detection and correction circuitry, the sampler circuitry configured to sample the sawtooth oscillator signal in response to the edge detection signal; and
adder circuitry coupled to the sampler circuitry and the edge detection and correction circuitry, the adder circuitry configured to subtract the edge correction signal from the sampled sawtooth oscillator signal to provide a phase estimate signal.

2. The phase detector circuitry of claim 1 further comprising averaging circuitry coupled to the adder circuitry and configured to receive and average a number of phase estimate signals to provide an average phase estimate signal.

3. The phase detector circuitry of claim 1 wherein the oscillator circuitry is configured to provide the sawtooth oscillator signal such that a value of the sawtooth oscillator signal varies between 0 and 360.

4. The phase detector circuitry of claim 3 wherein the edge detection and correction circuitry is configured to provide the edge correction signal such that:
   a value of the edge correction signal is 0 when the edge is a falling edge of the in-phase signal;
   the value of the edge correction signal is 180 when the edge is a rising edge of the in-phase signal;
   the value of the edge correction signal is 90 when the edge is a falling edge of the quadrature signal; and
   the value of the edge correction signal is 270 when the edge is a rising edge of the quadrature signal.

5. The phase detector circuitry of claim 1 wherein the in-phase signal and the quadrature signal are components of a wireless communication signal.

6. The phase detector circuitry of claim 5 wherein the wireless communication signal is a hard-limited signal.

7. A method for estimating phase comprising:
   receiving an in-phase signal and a quadrature signal by edge detection and correction circuitry;
   generating a sawtooth oscillator signal by oscillator circuitry;
   sampling the sawtooth oscillator signal at each edge of the in-phase signal and the quadrature signal by sampler circuitry, which is coupled to the oscillator circuitry and the edge detection and correction circuitry; and
   compensating the sampled sawtooth oscillator signal by adder circuitry based on whether the edge is in the in-phase signal or the quadrature signal and whether the edge is a rising edge or a falling edge to provide a phase estimate signal, wherein the adder circuitry is coupled to the sampler circuitry and the edge detection and correction circuitry.

8. The method of claim 7 further comprising averaging a plurality of phase estimate signals to provide an average phase estimate signal by averaging circuitry, which is coupled to the adder circuitry.

9. The method of claim 7 wherein generating the sawtooth oscillator signal comprises generating the sawtooth oscillator signal such that a value thereof varies between 0 and 360.

10. The method of claim 7 wherein compensating the sampled sawtooth oscillator signal based on whether the edge is in the in-phase signal or the quadrature signal and whether the edge is a rising edge or a falling edge to provide a phase estimate signal comprises:
    not changing a value of the sampled sawtooth oscillator signal when the edge is a falling edge of the in-phase signal;
    subtracting 180 from the sampled sawtooth oscillator signal when the edge is a rising edge of the in-phase signal;
    subtracting 90 from the sampled sawtooth oscillator signal when the edge is a falling edge of the quadrature signal; and
    subtracting 270 from the sampled sawtooth oscillator signal when the edge is a rising edge of the quadrature signal.

11. The method of claim 7 wherein the in-phase signal and the quadrature signal are components of a wireless communication signal.

12. The method of claim 11 wherein the wireless communication signal is a hard-limited signal.

* * * * *